United States Patent
Yang et al.

(10) Patent No.: US 7,892,899 B2
(45) Date of Patent: *Feb. 22, 2011

(54) HYBRID ORIENTATION SUBSTRATE AND METHOD FOR FABRICATION THEREOF

(75) Inventors: Haining S. Yang, Wappingers Falls, NY (US); Henry K. Utomo, Newburgh, NY (US); Judson R. Holt, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 167 days.

This patent is subject to a terminal disclaimer.

(21) Appl. No.: 12/244,944

(22) Filed: Oct. 3, 2008

(65) Prior Publication Data

US 2009/0029531 A1 Jan. 29, 2009

Related U.S. Application Data

(63) Continuation of application No. 11/559,151, filed on Nov. 13, 2006, now Pat. No. 7,482,209.

(51) Int. Cl.
*H01L 21/84* (2006.01)

(52) U.S. Cl. .............................. 438/150; 257/E21.561; 438/154

(58) Field of Classification Search ......... 438/151–166, 438/150; 257/E21.561
See application file for complete search history.

(56) References Cited

U.S. PATENT DOCUMENTS

| | | | |
|---|---|---|---|
| 7,087,965 B2 | 8/2006 | Chan et al. | |
| 7,291,886 B2 | 11/2007 | Doris et al. | |
| 7,329,923 B2 | 2/2008 | Doris et al. | |
| 7,332,384 B2 | 2/2008 | Buchholtz et al. | |
| 7,393,730 B2 | 7/2008 | Hsu et al. | |
| 7,482,209 B2 * | 1/2009 | Yang et al. ................... | 438/150 |
| 2005/0181549 A1 | 8/2005 | Barr et al. | |
| 2008/0102566 A1 | 5/2008 | Furukawa et al. | |

* cited by examiner

*Primary Examiner*—Richard A. Booth
(74) *Attorney, Agent, or Firm*—Scully, Scott, Murphy & Presser, P.C.; Ian D. MacKinnon, Esq.

(57) ABSTRACT

A method for fabricating a hybrid orientation substrate provides for: (1) a horizontal epitaxial augmentation of a masked surface semiconductor layer that leaves exposed a portion of a base semiconductor substrate; and (2) a vertical epitaxial augmentation of the exposed portion of the base semiconductor substrate. The resulting surface semiconductor layer and epitaxial surface semiconductor layer adjoin with an interface that is not perpendicular to the base semiconductor substrate. The method also includes implanting through the surface semiconductor layer and the epitaxial surface semiconductor layer a dielectric forming ion to provide a buried dielectric layer that separates the surface semiconductor layer and the epitaxial surface semiconductor layer from the base semiconductor substrate.

13 Claims, 2 Drawing Sheets

HYBRID ORIENTATION SUBSTRATE AND METHOD FOR FABRICATION THEREOF

CROSS-REFERENCE TO RELATED APPLICATIONS

This application is a continuation of U.S. patent application Ser. No. 11/559,151, filed Nov. 13, 2006, now U.S. Pat. No. 7,482,209.

BACKGROUND

1. Field of the Invention

The invention relates generally to hybrid orientation substrates. More particularly, the invention relates to hybrid orientation substrates with enhanced performance.

2. Description of the Related Art

Recent advances in semiconductor manufacturing technology have involved the use of hybrid orientation substrates. Hybrid orientation substrates are semiconductor substrates that include multiple surface semiconductor layers having differing crystallographic orientations. Typically, semiconductor devices of differing polarity or differing conductivity type are formed and located within the multiple surface semiconductor layers having the differing crystallographic orientations. Generally, the semiconductor devices of differing polarity or differing conductivity type benefit from the differing crystallographic orientations in terms of enhanced performance, such as enhanced charge carrier mobility. Thus, with respect to individual semiconductor devices a particular polarity or conductivity type thereof is mated with a particular crystallographic orientation to provide the semiconductor devices with enhanced performance.

As a specific example in accordance with the foregoing device polarity and surface semiconductor layer crystallographic orientation mating, n-FETs are preferably fabricated within (100) silicon or silicon-germanium alloy surface semiconductor layers. Analogously, p-FETs are preferably fabricated within (110) silicon or silicon-germanium alloy surface semiconductor layers.

While hybrid orientation substrates are thus desirable within the semiconductor fabrication art, hybrid orientation substrates are nonetheless not entirely without problems. In particular, hybrid orientation technology substrates are often formed using epitaxial methods for forming at least one of the different crystallographic orientation layers that comprise a hybrid orientation technology substrate. Since such epitaxial layers are often formed bounded by dielectric masking and blocking layers, such epitaxial layers are often formed only with defects.

Various semiconductor structures having desirable properties, and methods for fabrication thereof, are disclosed within the semiconductor fabrication art.

For example, Yang et al., in "High Performance CMOS Fabricated on Hybrid Substrate With Different Crystallographic Orientations," IEEE International Electron Devices Meeting Technical Digest, 8-10 Dec. 2003, pages 18.7.1-18.7.4, teaches one particular method for fabricating a hybrid orientation substrate that may be used for fabricating a complementary metal oxide semiconductor (CMOS) structure. The particular method uses a semiconductor substrate laminating and bonding method followed by a selective epitaxial growth method.

A need for enhanced performance of both n-FET devices and p-FET devices within CMOS structures is likely to continue to be of importance within CMOS device fabrication. To that end, the use of hybrid orientation substrates for fabrication of CMOS devices is also likely to continue. Thus, a need to fabricate hybrid orientation substrates with enhanced performance and enhanced manufacturability is similarly also likely to continue.

SUMMARY

The invention includes a hybrid orientation substrate and related methods for fabricating the hybrid orientation substrate. The hybrid orientation substrate in accordance with the invention includes a plurality of crystallographic orientation regions that adjoin and have an interface non-perpendicular with respect to a plane of the hybrid orientation substrate.

A hybrid orientation substrate in accordance with the invention includes a first surface semiconductor layer located over a substrate and having a first crystallographic orientation. The hybrid orientation substrate also includes a second surface semiconductor layer located laterally adjoining the first surface semiconductor layer over the substrate and having a second crystallographic orientation different than the first crystallographic orientation. Within the hybrid orientation substrate in accordance with the invention, an interface between the first surface semiconductor layer and the second surface semiconductor layer is not perpendicular to the substrate.

A method for fabricating a hybrid orientation substrate in accordance with the invention includes forming a surface semiconductor layer over a base semiconductor substrate to leave exposed a portion of the base semiconductor substrate. The method also includes epitaxially horizontally growing the surface semiconductor layer to form a horizontally augmented surface semiconductor layer and epitaxially vertically growing the base semiconductor substrate to form an epitaxial surface semiconductor layer. Within the method, the horizontally augmented surface semiconductor layer and the epitaxial surface semiconductor layer contact at an interface not perpendicular to the base semiconductor substrate.

Another method for fabricating a hybrid orientation substrate in accordance with the invention also includes forming a surface semiconductor layer over a base semiconductor substrate to leave exposed a portion of the base semiconductor substrate. This other method also includes epitaxially horizontally growing the surface semiconductor layer to form a horizontally augmented surface semiconductor layer and epitaxially vertically growing the base semiconductor substrate to form an epitaxial surface semiconductor layer. Within is other method, the horizontally augmented surface semiconductor layer and the epitaxial surface semiconductor layer contact at an interface not perpendicular to the base semiconductor substrate. Finally, this other method also includes implanting a dielectric forming ion through the horizontally augmented surface semiconductor layer and the epitaxial surface semiconductor layer to form a buried dielectric layer separating both the horizontally augmented surface semiconductor layer and the epitaxial surface semiconductor layer from the base semiconductor substrate.

BRIEF DESCRIPTION OF THE DRAWINGS

The objects, features and advantages of the invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The invention, which includes a hybrid orientation substrate and a method for fabricating the hybrid orientation substrate, is understood within the context of the description that follows. The description that follows is understood within the context of the drawings described above. Since the drawings are intended for illustrative purposes, the drawings are not necessarily drawn to scale.

FIG. 1 to FIG. 7 show a series of schematic cross-sectional diagrams illustrating the results of progressive stages in fabricating a semiconductor structure in accordance with a particular embodiment of the invention that comprises a preferred embodiment of the invention. The semiconductor structure comprises a CMOS structure that includes a hybrid orientation substrate fabricated in accordance with the preferred embodiment.

Figure 1:
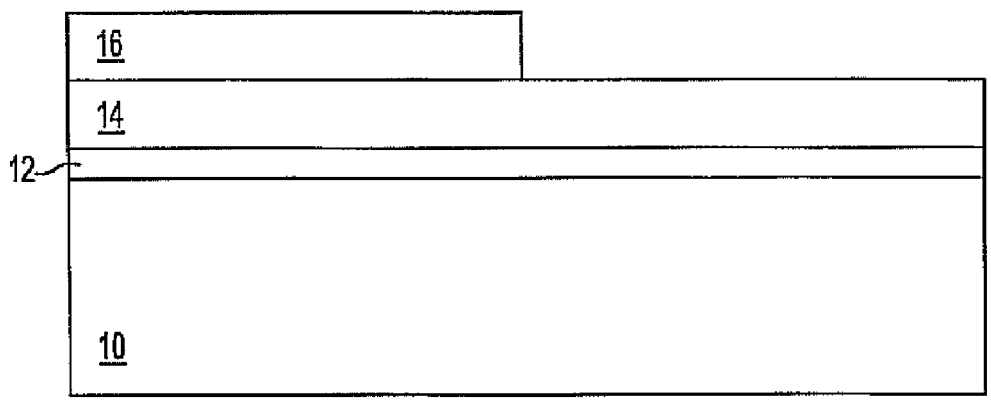
FIG. 1 to FIG. 7 show a series of schematic cross-sectional diagrams illustrating the results of progressive stages in fabricating a semiconductor structure in accordance with a particular embodiment of the invention. This particular embodiment of the invention comprises a preferred embodiment of the invention. The semiconductor structure comprises a CMOS structure that includes a hybrid orientation substrate fabricated in accordance with the preferred embodiment.

FIG. 1 shows a base semiconductor substrate 10. A buried dielectric layer 12 is located upon the base semiconductor substrate 10 and a surface semiconductor layer 14 is located upon the buried dielectric layer 12. In an aggregate, the base semiconductor substrate 10, the buried dielectric layer 12 and the surface semiconductor layer 14 comprise a semiconductor-on-insulator substrate.

The base semiconductor substrate 10 may comprise any of several semiconductor materials. Non-limiting examples include silicon, germanium, silicon-germanium alloy, silicon carbide, silicon-germanium carbide alloy and compound (i.e., III-V and II-VI) semiconductor materials. Non-limiting examples of compound semiconductor materials include gallium arsenide, indium arsenide and indium phosphide semiconductor materials. Typically, the base semiconductor substrate 10 has a thickness from about 0.5 to about 1.5 mm.

The buried dielectric layer 12, which is optional within the embodiment and the invention, may comprise any of several dielectric materials. Non-limiting examples include oxides, nitrides and oxynitrides, particularly of silicon, but oxides, nitrides and oxynitrides of other elements are not excluded. The buried dielectric layer 12 may comprise a crystalline or a non-crystalline dielectric material, with crystalline dielectric materials being highly preferred. The buried dielectric layer 12 may be formed using any of several methods. Non-limiting examples include ion implantation methods, thermal or plasma oxidation or nitridation methods, chemical vapor deposition methods and physical vapor deposition methods. Typically, the buried dielectric layer 12 comprises an oxide of the semiconductor material from which is comprised the semiconductor substrate 10. Typically, the buried dielectric layer 12 has a generally limited thickness from about 0 to about 1500 angstroms, and more preferably from about 10 to about 300 angstroms.

The surface semiconductor layer 14 may comprise any of the several semiconductor materials from which the base semiconductor substrate 10 may be comprised. The surface semiconductor layer 14 and the base semiconductor substrate 10 may comprise either identical or different semiconductor materials with respect to chemical composition and dopant concentration. Typically the surface semiconductor layer 14 will differ in comparison with the base semiconductor substrate 10 with respect to dopant polarity and crystallographic orientation. In particular, one of the surface semiconductor layer 14 and the base semiconductor substrate 10 will typically comprise one of: (1) a (100) silicon or silicon-germanium alloy semiconductor material doped appropriately for fabrication of an n-FET; and (2) a (110) silicon or silicon-germanium alloy semiconductor material doped appropriately for fabrication of a p-FET. Typically, the other of the surface semiconductor layer 14 and the base semiconductor substrate will typically comprise the other of the foregoing (100) silicon or silicon-germanium alloy semiconductor material and the (110) silicon or silicon-germanium alloy semiconductor material. Typically, the surface semiconductor layer 14 has a thickness from about 500 to about 1000 angstroms.

The semiconductor-on-insulator substrate that is illustrated in FIG. 1 may be fabricated using any of several methods. Non-limiting examples include layer lamination methods, layer transfer methods and separation by implantation of oxygen (SIMOX) methods.

FIG. 1 finally shows a mask layer 16 located upon the surface semiconductor layer 14 and leaving exposed a portion (i.e., a right hand portion) of the surface semiconductor layer 14. The mask layer 16 may comprise any of several mask materials. Non-limiting examples include photoresist mask materials and hard mask materials. In turn, non-limiting examples of photoresist materials include positive photoresist materials, negative photoresist materials and hybrid photoresist materials. For comparison purposes, non-limiting examples of hard mask materials include the same materials that may be used for forming the optional buried dielectric layer 12.

Typically, the mask layer 16 comprises a hard mask material, such as in particular, a silicon nitride hard mask material. The hard mask material may be formed using methods including, but not limited to chemical vapor deposition methods and physical vapor deposition methods. Typically, the mask layer 16 has a thickness from about 200 to about 1000 angstroms.

Figure 2:
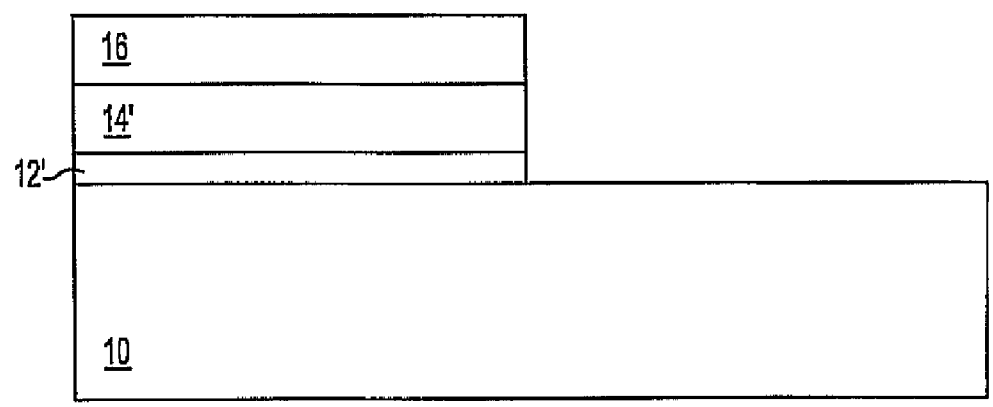

FIG. 2 shows the results of etching the surface semiconductor layer 14 and the optional buried dielectric layer 12 to form a surface semiconductor layer 14' and an optional buried dielectric layer 12'. The foregoing etching is effected while using the mask layer 16 as an etch mask layer and the base semiconductor substrate 10 as an etch stop layer. The foregoing etching may be effected using methods and materials that are otherwise generally conventional in the semiconductor fabrication art. Non-limiting examples include wet chemical etch methods and materials, as well as dry plasma etch methods and materials. Dry plasma etch methods and materials are considerably more common insofar as dry plasma etch methods and materials provide generally straighter sidewalls to the surface semiconductor layer 14' and the optional buried dielectric layer 12'. Typically, dry plasma etch methods use a fluorine containing etchant gas composition for etching a silicon containing dielectric material, or a chlorine containing etchant gas composition for etching a silicon containing semiconductor material.

Figure 3:
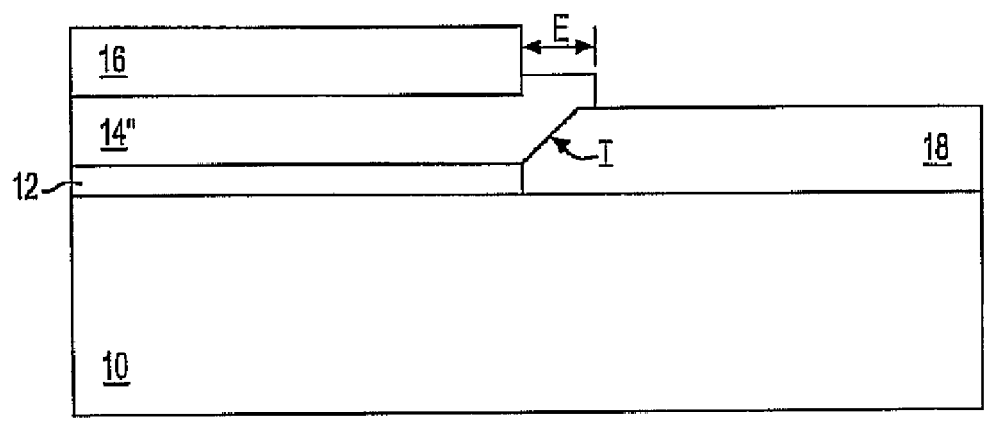

FIG. 3 shows the results of epitaxially horizontally growing and augmenting the surface semiconductor layer 14' to form a horizontally augmented surface semiconductor layer 14" and epitaxially vertically growing the base semiconductor substrate 10 to form an epitaxial surface semiconductor layer 18 thereupon. As is illustrated within the schematic cross-sectional diagram of FIG. 3, the surface semiconductor layer 14" and the epitaxial surface semiconductor layer 18 contact at an interface I that is not perpendicular to the base semiconductor substrate 10 (i.e., such a perpendicular component is absent within the interface I). The foregoing horizontal epitaxial growth of the surface semiconductor layer 14' and vertical epitaxial growth of the base semiconductor substrate 10 is effected absent a spacer layer located covering a sidewall of the surface semiconductor layer 14' that is illustrated in FIG. 2.

As is understood by a person skilled in the art, a thickness of the optional buried dielectric layer 12 influences a horizontal growth of the surface semiconductor layer 14' when forming the surface semiconductor layer 14''. In particular, a thicker buried dielectric layer 12 provides a greater horizontal growth of the surface semiconductor layer 14' when forming the surface semiconductor layer 14''. Typically, the interface I of the surface semiconductor layer 14'' with the epitaxial surface semiconductor layer 18 will have an angle from about 15 to about 75 degrees with respect to the plane of the base semiconductor substrate 10. Typically, a horizontal extension E of the surface semiconductor layer 14'' with respect to the surface semiconductor layer 14' will be approximately equivalent to the thickness of the epitaxial surface semiconductor layer 18.

Figure 4:
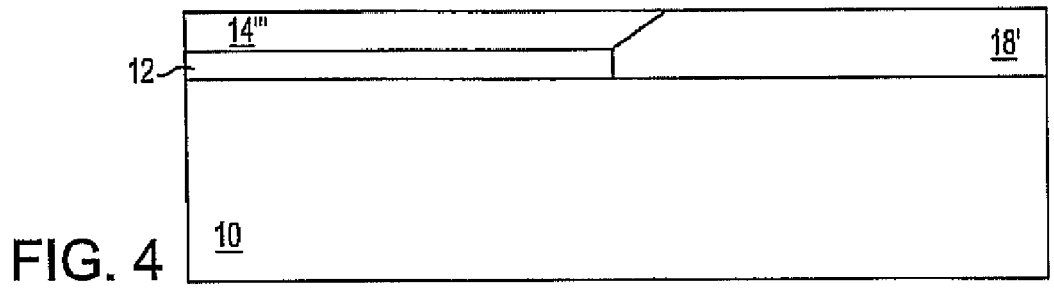

FIG. 4 shows the results of optionally planarizing the surface semiconductor layer 14'' to form a surface semiconductor layer 14''' and simultaneously co-planarizing the epitaxial surface semiconductor layer 18 to form a co-planar epitaxial surface semiconductor layer 18'. The foregoing planarization may be effected using methods that are conventional in the semiconductor fabrication art. Non-limiting examples include mechanical planarizing methods and chemical mechanical polish planarizing methods. Chemical mechanical polish planarizing methods are particularly common. Typically, the surface semiconductor layer 14'' and the epitaxial surface semiconductor layer 18 are co-planarized to form the surface semiconductor layer 14''' and the epitaxial surface semiconductor layer 18' while using a chemical mechanical polish planarizing method that provides for adequate co-planarity of the surface semiconductor layer 14''' and the epitaxial surface semiconductor layer 18'.

Figure 5:
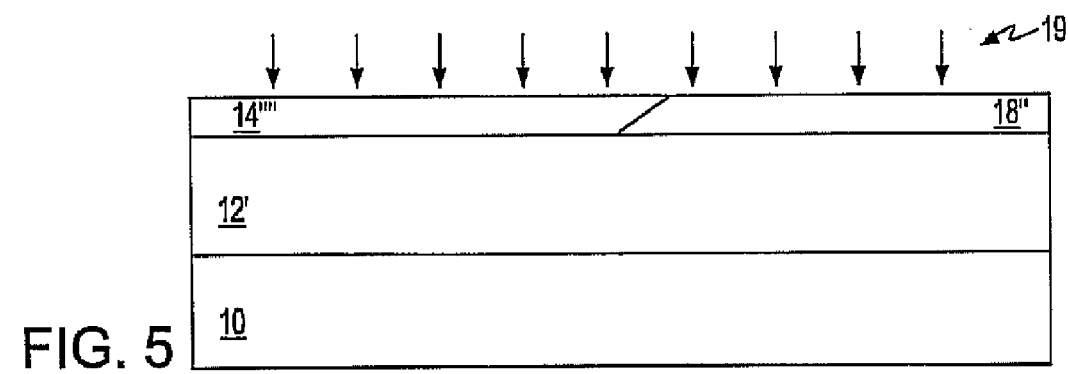

FIG. 5 shows the results of ion implanting (i.e., using a dose of dielectric forming implanting ions 19) and thermally annealing the semiconductor structure of FIG. 4. The ion implanting and thermal annealing provides: (1) a horizontally and vertically augmented buried dielectric layer 12' from the buried dielectric layer 12; (2) a vertically thinned surface semiconductor layer 18'' from the surface semiconductor layer 18'; and (3) a vertically thinned base semiconductor substrate 10' from the base semiconductor substrate 10. The ion implantation typically uses a dose of oxygen dopant ions and/or nitrogen dopant ions at an ion implantation dose of from about 5E17 to about 5E18 oxygen dopant ions per square centimeter and a variable ion implantation energy in a range from about 80 to about 200 keV. Within the context of the foregoing conditions, and upon thermal annealing at a temperature from about 950 to about 1175 degrees centigrade, the buried dielectric layer 12' typically has a thickness from about 1000 to about 2000 angstroms. FIG. 5 thus illustrates a surface semiconductor layer 14'''' laterally adjoining an epitaxial surface semiconductor layer 18'' of same thickness in a range from about 100 to about 1000 angstroms, with an interface I therebetween that is not perpendicular (i.e., no portion of which is perpendicular) to the base semiconductor substrate 10'.

Figure 6:
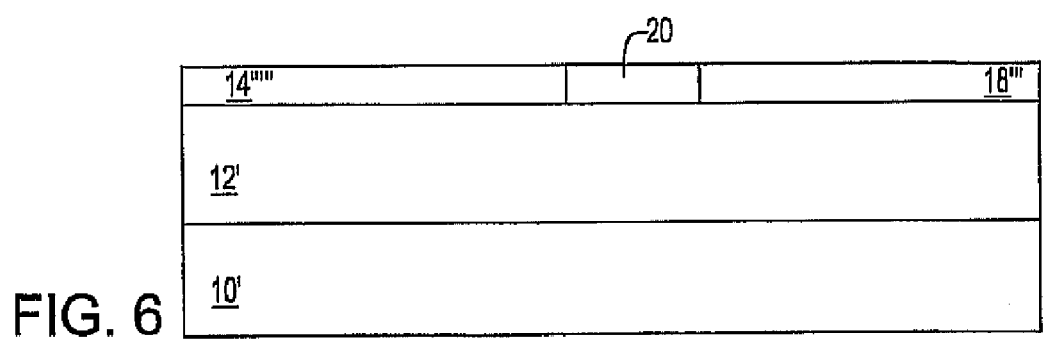

FIG. 6 shows the results of forming an optional, but preferred, isolation region 20 that separates a surface semiconductor layer 14'''' from an epitaxial surface semiconductor layer 18'''. The semiconductor structure of FIG. 6 is fabricated from the semiconductor structure of FIG. 5 by first patterning the surface semiconductor layer 14'''' and the epitaxial surface semiconductor layer 18''' at the location of the interface therebetween (as is illustrated in FIG. 6) to form an isolation trench that is bounded by the surface semiconductor layer 14'''' and the epitaxial surface semiconductor layer 18'''. The isolation trench is then filled with a dielectric material that is subsequently planarized to form the isolation region 20.

The dielectric material may be selected from the group consisting of oxides, nitrides and oxynitrides of silicon. Oxides, nitrides and oxynitrides of other elements are not excluded. The dielectric material may be deposited using methods including but not limited to chemical vapor deposition methods and physical vapor deposition methods. The planarization may be effected using methods that are conventional in the semiconductor fabrication art. Non-limiting examples include mechanical planarizing methods and chemical mechanical polish planarizing methods. Chemical mechanical polish planarizing methods are particularly common.

Figure 7:
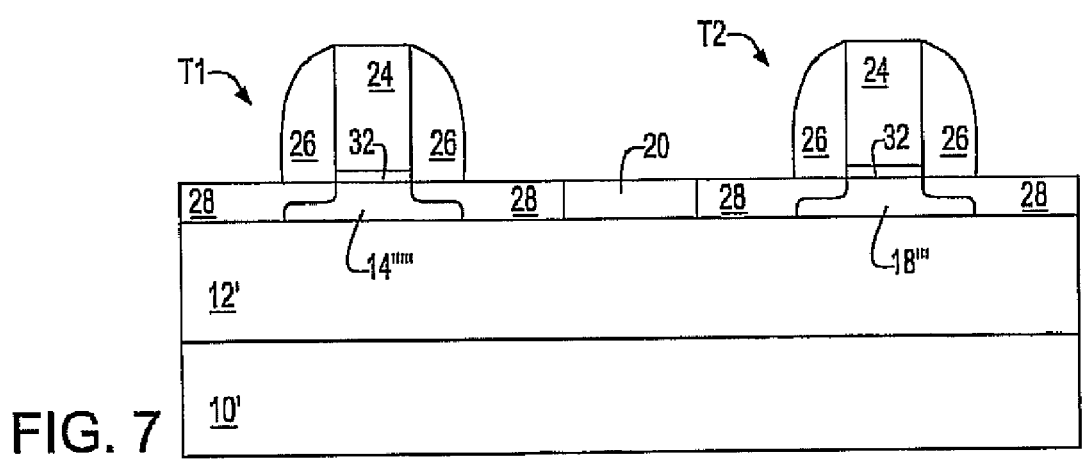

FIG. 7 shows a first transistor T1 located using the surface semiconductor layer 14'''' as a semiconductor substrate and a second transistor T2 located using the epitaxial surface semiconductor layer 18''' as a semiconductor substrate. Each of the first transistor T1 and the second transistor T2 includes: (1) a gate dielectric 22 located upon the surface semiconductor layer 14'''' or the epitaxial surface semiconductor layer 18'''; (2) a gate electrode 24 located upon the gate dielectric 22; (3) a pair (in cross-section, but a single layer in plan view) of spacers 26 located adjoining a pair of opposite sidewalls of the gate dielectric 22 and the gate electrode 24; and (5) a pair of source/drain regions 28 located within the surface semiconductor layer 14'''' or the epitaxial surface semiconductor layer 18'''. The pair of source/drain regions 28 is separated by a channel region that is aligned beneath the gate electrode 24. Each of the foregoing layers and structures that comprise the first transistor T1 and the second transistor T2 may comprise materials and have dimensions that are conventional in the semiconductor fabrication art. Each of the foregoing layers and structures that comprise the first transistor T1 and the second transistor T2 may also be formed using methods that are conventional in the semiconductor fabrication art.

The gate dielectrics 22 may comprise conventional dielectric materials such as oxides, nitrides and oxynitrides of silicon that have a dielectric constant from about 4 to about 20, measured in vacuum. Alternatively, the gate dielectrics 22 may comprise generally higher dielectric constant dielectric materials having a dielectric constant from about 20 to at least about 100. Such higher dielectric constant dielectric materials may include, but are not limited to, hafnium oxides, hafnium silicates, titanium oxides, barium-strontium-titantates (BSTs) and lead-zirconate-titanates (PZTs). The gate dielectrics 22 may be formed using any of several methods that are appropriate to their materials of composition. Non-limiting examples include thermal or plasma oxidation or nitridation methods, chemical vapor deposition methods and physical vapor deposition methods. Typically, the gate dielectrics 22 comprise a thermal silicon oxide dielectric material that has a thickness from about 10 to about 70 angstroms.

The gate electrodes 24 may comprise materials including, but not limited to certain metals, metal alloys, metal nitrides and metal silicides, as well as laminates thereof and composites thereof. The gate electrodes 24 may also comprise doped polysilicon and polysilicon-germanium alloy materials (i.e., having a dopant concentration from about 1e18 to about 1e22 dopant atoms per cubic centimeter) and polycide materials (doped polysilicon/metal silicide stack materials). Similarly, the foregoing materials may also be formed using any of several methods. Non-limiting examples include salicide methods, chemical vapor deposition methods and physical vapor deposition methods, such as, but not limited to evaporative methods and sputtering methods. Typically, the gate electrode 24 comprises a doped polysilicon material that has a thickness from about 600 to about 2000 angstroms.

The spacers 26 may comprise materials including, but not limited to conductor materials and dielectric materials. Conductor spacer materials are less common, but are nonetheless known. Dielectric spacer materials are more common. The spacer materials may be formed using methods analogous, equivalent or identical to the methods that are used for forming the buried dielectric layer 12. The spacers 26 are also formed with the distinctive inward pointing spacer shape by using a blanket layer deposition and anisotropic etchback method. Typically, the spacers 26 comprise a silicon oxide dielectric material.

Finally, the source/drain regions 28 comprise a generally conventional n conductivity type dopant or p conductivity type dopant. As is understood by a person skilled in the art, the source/drain regions 28 are formed using a two step ion implantation method. A first ion implantation process step within the method uses the gate electrodes 24, absent the spacers 26, as a mask to form extension regions each of which extends beneath the spacers 26. A second ion implantation process step uses the gate electrode 24 and the spacers 26 as a mask to form the larger contact region portions of the source/drain regions 28, while simultaneously incorporating the pair of extension regions. n conductivity type dopant levels and p conductivity type dopant levels are from about 1e19 to about 1e21 dopant atoms per cubic centimeter within each of the source/drain regions 28. Extension regions within the source/drain regions 28 may under certain circumstances be more lightly doped than contact regions with the source/drain regions 28, although such differential doping concentrations are not a requirement of the invention.

FIG. 7 shows a CMOS structure fabricated within a hybrid orientation substrate in turn fabricated in accordance with a method of the invention. The hybrid orientation substrate includes a surface semiconductor layer 14'''' and an epitaxial surface semiconductor layer 18''' each of different crystallographic orientation and of appropriate dopant polarity and dopant concentration for further fabrication of a CMOS structure.

The hybrid orientation substrate in accordance with the invention provides, as illustrated within the schematic cross-sectional diagram of FIG. 5, that the surface semiconductor layer 14'''' (i.e., a first surface semiconductor layer) contacts the epitaxial surface semiconductor layer 18'' (i.e., a second surface semiconductor layer) with an interface therebetween that is not perpendicular (i.e., no portion of which is perpendicular) to the base semiconductor substrate 10'. A method for fabricating the hybrid orientation substrate in accordance with the invention includes (as is illustrated in FIG. 2) forming a surface semiconductor layer 14' partially covering a base semiconductor substrate 10 within a semiconductor-on-insulator substrate that may optionally exclude a buried dielectric layer 12'. Due to a limited thickness of the buried dielectric layer 12', the epitaxial surface semiconductor layer 18 (as is illustrated in FIG. 3) is grown from the exposed portion of the base semiconductor substrate 10 with limited incursion from lateral growth E of the surface semiconductor layer 14''. Since no spacer layer is used adjoining the surface semiconductor layer 14' that would otherwise block formation of the epitaxial surface semiconductor layer 18, the epitaxial surface semiconductor layer 18 is also formed with desirably inhibited defects.

The preferred embodiment of the invention is illustrative of the invention rather than limiting of the invention. Revisions and modifications may be made to methods, materials, structures and dimensions of a semiconductor structure in accordance with the preferred embodiment while still providing a semiconductor structure in accordance with the invention, further in accordance with the accompanying claims.

What is claimed is:

1. A method for fabricating a hybrid orientation substrate comprising:
   forming a surface semiconductor layer over a base semiconductor substrate to leave exposed a portion of the base semiconductor substrate; and
   epitaxially horizontally growing the surface semiconductor layer to form a horizontally augmented surface semiconductor layer and epitaxially vertically growing the base semiconductor substrate to form an epitaxial surface semiconductor layer, the horizontally augmented surface semiconductor layer and the epitaxial surface semiconductor layer contacting at an interface not perpendicular to the base semiconductor substrate.

2. The method of claim 1 wherein the surface semiconductor layer is horizontally grown and the base semiconductor substrate is vertically grown absent a spacer formed adjoining a sidewall of the surface semiconductor layer.

3. The method of claim 1 wherein the forming the surface semiconductor layer over the base semiconductor substrate includes forming a buried dielectric layer interposed between the base semiconductor substrate and the surface semiconductor layer.

4. The method of claim 1 wherein the forming the surface semiconductor layer over the base semiconductor substrate does not include forming a buried dielectric layer interposed between the base semiconductor substrate and the surface semiconductor layer.

5. The method of claim 1 further comprising planarizing the horizontally augmented surface semiconductor layer and the epitaxial surface semiconductor layer to coplanarity.

6. The method of claim 1 further comprising forming a first transistor having a first polarity within the horizontally augmented surface semiconductor layer and forming a second transistor having a second polarity different than the first polarity within the epitaxial surface semiconductor layer.

7. A method for fabricating a hybrid orientation substrate comprising:
   forming a surface semiconductor layer over a base semiconductor substrate to leave exposed a portion of the base semiconductor substrate;
   epitaxially horizontally growing the surface semiconductor layer to form a horizontally augmented surface semiconductor layer and epitaxially vertically growing the base semiconductor substrate to form an epitaxial surface semiconductor layer, the horizontally augmented surface semiconductor layer and the epitaxial surface semiconductor layer contacting at an interface not perpendicular to the base semiconductor substrate; and
   implanting a dielectric forming ion through the horizontally augmented surface semiconductor layer and the epitaxial surface semiconductor layer to form a buried dielectric layer separating both the horizontally augmented surface semiconductor layer and the epitaxial surface semiconductor layer from the base semiconductor substrate.

8. The method of claim 7 wherein the surface semiconductor layer is horizontally grown and the epitaxial surface semiconductor layer is vertically grown absent a spacer formed adjoining a sidewall of the surface semiconductor layer.

9. The method of claim 7 wherein the forming the surface semiconductor layer over the base semiconductor substrate includes forming a buried dielectric layer interposed between the base semiconductor substrate and the surface semiconductor layer.

10. The method of claim 7 wherein the forming the surface semiconductor layer over the base semiconductor substrate does not include forming a buried dielectric layer interposed between the base semiconductor substrate and the surface semiconductor layer.

11. The method of claim 7 further comprising planarizing the horizontally augmented surface semiconductor layer and the epitaxial surface semiconductor layer to coplanarity.

12. The method of claim 7 further comprising forming a first transistor having a first polarity within the horizontally augmented surface semiconductor layer and forming a second transistor having a second polarity different than the first polarity within the epitaxial surface semiconductor layer.

13. The method of claim 12 wherein the first polarity is an n polarity and the first crystallographic orientation is a (100) crystallographic orientation and the second polarity is a p polarity and the second crystallographic orientation is a (110) crystallographic orientation.

* * * * *